(12) United States Patent
Jayabharathi

(10) Patent No.: US 8,015,448 B2
(45) Date of Patent: Sep. 6, 2011

(54) SYSTEM AND METHOD FOR CONDUCTING BIST OPERATIONS

(75) Inventor: Dinesh Jayabharathi, Orange, CA (US)

(73) Assignee: Marvell International Ltd., Hamilton (BM)

( * ) Notice: Subject to any disclaimer, the term of this patent is extended or adjusted under 35 U.S.C. 154(b) by 599 days.

(21) Appl. No.: 11/820,226

(22) Filed: Jun. 19, 2007

(65) Prior Publication Data
US 2007/0250740 A1    Oct. 25, 2007

Related U.S. Application Data

(63) Continuation of application No. 10/983,944, filed on Nov. 8, 2004, now Pat. No. 7,240,267.

(51) Int. Cl.
*G06F 11/00* (2006.01)
(52) U.S. Cl. .............................. 714/30; 714/42; 714/733
(58) Field of Classification Search .................... 714/30, 714/42, 733
See application file for complete search history.

(56) References Cited

U.S. PATENT DOCUMENTS

| | | |
|---|---|---|
| 3,800,281 A | 3/1974 | Devore et al. |
| 3,988,716 A | 10/1976 | Fletcher et al. |
| 4,001,883 A | 1/1977 | Strout et al. |
| 4,016,368 A | 4/1977 | Apple, Jr. |
| 4,050,097 A | 9/1977 | Miu et al. |
| 4,080,649 A | 3/1978 | Calle |
| 4,156,867 A | 5/1979 | Bench et al. |
| 4,225,960 A | 9/1980 | Masters |
| 4,275,457 A | 6/1981 | Leighou et al. |
| 4,390,969 A | 6/1983 | Hayes |
| 4,451,898 A | 5/1984 | Palermo et al. |
| 4,486,750 A | 12/1984 | Aoki |
| 4,500,926 A | 2/1985 | Yoshimaru et al. |
| 4,587,609 A | 5/1986 | Boudreau et al. |
| 4,603,382 A | 7/1986 | Cole |
| 4,625,321 A | 11/1986 | Pechar et al. |
| 4,667,286 A | 5/1987 | Young et al. |
| 4,777,635 A | 10/1988 | Glover |
| 4,805,046 A | 2/1989 | Kuroki et al. |

(Continued)

FOREIGN PATENT DOCUMENTS

EP   0528273   2/1993

(Continued)

OTHER PUBLICATIONS

PCT International Search Report, Doc. No. PCT/US00/15084, Dated Nov. 15, 2000, 2 pages.

(Continued)

*Primary Examiner* — Scott T Baderman
*Assistant Examiner* — Loan Truong

(57) ABSTRACT

A storage controller including a first controller. The first controller includes a memory module, a test access port controller, the test access port controller configured to control a built in self-test operation on the memory module, and a register configured to store a first instruction. In response to the storage controller detecting a test access port interface being accessible to the storage controller, the test access port controller is configured to control the built in self-test operation on the memory module of the first controller by having either (i) a second instruction sent from the test access port controller to the first controller or (ii) the first instruction sent from the register to the first controller. The first controller is configured to perform the built in self-test operation on the memory module in response to having received the first instruction or having received the second instruction.

13 Claims, 4 Drawing Sheets

U.S. PATENT DOCUMENTS

| | | |
|---|---|---|
| 4,807,116 A | 2/1989 | Katzman et al. |
| 4,807,253 A | 2/1989 | Hagenauer et al. |
| 4,809,091 A | 2/1989 | Miyazawa et al. |
| 4,811,282 A | 3/1989 | Masina |
| 4,812,769 A | 3/1989 | Agoston |
| 4,860,333 A | 8/1989 | Bitzinger et al. |
| 4,866,606 A | 9/1989 | Kopetz |
| 4,881,232 A | 11/1989 | Sako et al. |
| 4,920,535 A | 4/1990 | Watanabe et al. |
| 4,949,342 A | 8/1990 | Shimbo et al. |
| 4,970,418 A | 11/1990 | Masterson |
| 4,972,417 A | 11/1990 | Sako et al. |
| 4,975,915 A | 12/1990 | Sako et al. |
| 4,989,190 A | 1/1991 | Kuroe et al. |
| 5,014,186 A | 5/1991 | Chisholm |
| 5,023,612 A | 6/1991 | Liu |
| 5,027,357 A | 6/1991 | Yu et al. |
| 5,050,013 A | 9/1991 | Holsinger |
| 5,051,998 A | 9/1991 | Murai et al. |
| 5,068,755 A | 11/1991 | Hamilton et al. |
| 5,068,857 A | 11/1991 | Yoshida |
| 5,072,420 A | 12/1991 | Conley |
| 5,088,093 A | 2/1992 | Storch et al. |
| 5,109,500 A | 4/1992 | Isek et al. |
| 5,117,442 A | 5/1992 | Hall |
| 5,127,098 A | 6/1992 | Rosenthal et al. |
| 5,133,062 A | 7/1992 | Joshi et al. |
| 5,136,592 A | 8/1992 | Wemg |
| 5,146,585 A | 9/1992 | Smith, III |
| 5,157,669 A | 10/1992 | Yu et al. |
| 5,162,954 A | 11/1992 | Miller et al. |
| 5,193,197 A | 3/1993 | Thacker |
| 5,204,859 A | 4/1993 | Paesler et al. |
| 5,220,569 A | 6/1993 | Hartness |
| 5,237,593 A | 8/1993 | Fisher et al. |
| 5,243,471 A | 9/1993 | Shinn |
| 5,249,271 A | 9/1993 | Hopkinson |
| 5,257,143 A | 10/1993 | Zangenehpour |
| 5,261,081 A | 11/1993 | White et al. |
| 5,271,018 A | 12/1993 | Chan |
| 5,274,509 A | 12/1993 | Buch |
| 5,276,564 A | 1/1994 | Hessing et al. |
| 5,276,662 A | 1/1994 | Shaver, Jr. et al. |
| 5,276,807 A | 1/1994 | Kodama |
| 5,280,488 A | 1/1994 | Glover et al. |
| 5,285,327 A | 2/1994 | Hetzler |
| 5,285,451 A | 2/1994 | Henson |
| 5,301,333 A | 4/1994 | Lee |
| 5,307,216 A | 4/1994 | Cook et al. |
| 5,315,708 A | 5/1994 | Eidler et al. |
| 5,339,443 A | 8/1994 | Lockwood |
| 5,361,266 A | 11/1994 | Kodama et al. |
| 5,361,267 A | 11/1994 | Goaiwala et al. |
| 5,408,644 A | 4/1995 | Schneider |
| 5,420,984 A | 5/1995 | Good et al. |
| 5,428,627 A | 6/1995 | Gupta |
| 5,440,751 A | 8/1995 | Santeler et al. |
| 5,465,343 A | 11/1995 | Henson |
| 5,487,170 A | 1/1996 | Bass |
| 5,488,688 A | 1/1996 | Gonzales et al. |
| 5,491,701 A | 2/1996 | Zook |
| 5,500,848 A | 3/1996 | Best et al. |
| 5,506,989 A | 4/1996 | Boldt |
| 5,507,005 A | 4/1996 | Kojima |
| 5,519,837 A | 5/1996 | Tran |
| 5,523,903 A | 6/1996 | Hetzler et al. |
| 5,544,180 A | 8/1996 | Gupta |
| 5,544,346 A | 8/1996 | Amini |
| 5,546,545 A | 8/1996 | Rich |
| 5,546,548 A | 8/1996 | Chen |
| 5,563,896 A | 10/1996 | Nakaguchi |
| 5,568,437 A * | 10/1996 | Jamal ........................... 365/201 |
| 5,570,375 A * | 10/1996 | Tsai et al. ...................... 714/727 |
| 5,572,148 A | 11/1996 | Lytle et al. |
| 5,574,867 A | 11/1996 | Khaira |
| 5,581,715 A | 12/1996 | Verinsky et al. |
| 5,583,999 A | 12/1996 | Sato |
| 5,592,404 A | 1/1997 | Zook |
| 5,600,662 A | 2/1997 | Zook et al. |
| 5,602,857 A | 2/1997 | Zook et al. |
| 5,615,190 A | 3/1997 | Best et al. |
| 5,623,672 A | 4/1997 | Popat |
| 5,627,695 A | 5/1997 | Prins et al. |
| 5,629,949 A | 5/1997 | Zook |
| 5,640,602 A | 6/1997 | Takase |
| 5,649,230 A | 7/1997 | Lentz |
| 5,664,121 A | 9/1997 | Cerauskis |
| 5,689,656 A | 11/1997 | Baden |
| 5,691,994 A | 11/1997 | Acosta |
| 5,692,135 A | 11/1997 | Alvarez |
| 5,692,165 A | 11/1997 | Jeddeloh et al. |
| 5,719,516 A | 2/1998 | Sharpe-Geisler |
| 5,729,718 A | 3/1998 | Au |
| 5,740,466 A | 4/1998 | Geldman |
| 5,745,793 A | 4/1998 | Atsatt et al. |
| 5,754,759 A | 5/1998 | Clarke et al. |
| 5,758,188 A | 5/1998 | Appelbaum et al. |
| 5,784,569 A | 7/1998 | Miller |
| 5,794,073 A | 8/1998 | Ramakrishnan |
| 5,801,998 A | 9/1998 | Choi |
| 5,818,886 A | 10/1998 | Castle |
| 5,822,142 A | 10/1998 | Hicken |
| 5,831,922 A | 11/1998 | Choi |
| 5,835,930 A | 11/1998 | Dobbek |
| 5,841,722 A | 11/1998 | Willenz |
| 5,844,844 A | 12/1998 | Bauer et al. |
| 5,850,422 A | 12/1998 | Chen |
| 5,854,918 A | 12/1998 | Baxter |
| 5,872,793 A * | 2/1999 | Attaway et al. ............... 714/726 |
| 5,890,207 A | 3/1999 | Sne et al. |
| 5,890,210 A | 3/1999 | Ishii et al. |
| 5,907,717 A | 5/1999 | Ellis |
| 5,912,906 A | 6/1999 | Wu et al. |
| 5,925,135 A | 7/1999 | Trieu et al. |
| 5,937,435 A | 8/1999 | Dobbek et al. |
| 5,950,223 A | 9/1999 | Chiang et al. |
| 5,968,180 A | 10/1999 | Baco |
| 5,983,293 A | 11/1999 | Murakami |
| 5,991,911 A | 11/1999 | Zook |
| 6,029,226 A | 2/2000 | Ellis et al. |
| 6,029,250 A | 2/2000 | Keeth |
| 6,041,417 A | 3/2000 | Hammond et al. |
| 6,065,053 A | 5/2000 | Nouri |
| 6,067,206 A | 5/2000 | Hull et al. |
| 6,070,200 A | 5/2000 | Gates et al. |
| 6,073,254 A * | 6/2000 | Whetsel ........................ 714/30 |
| 6,078,447 A | 6/2000 | Sim |
| 6,078,546 A | 6/2000 | Lee |
| 6,081,849 A | 6/2000 | Born et al. |
| 6,092,231 A | 7/2000 | Sze |
| 6,094,320 A | 7/2000 | Ahn |
| 6,124,994 A | 9/2000 | Malone, Sr. |
| 6,134,063 A | 10/2000 | Weston-Lewis et al. |
| 6,157,984 A | 12/2000 | Fisher |
| 6,178,486 B1 | 1/2001 | Gill |
| 6,192,499 B1 | 2/2001 | Yang |
| 6,201,655 B1 | 3/2001 | Watanabe et al. |
| 6,223,303 B1 | 4/2001 | Billings et al. |
| 6,279,089 B1 | 8/2001 | Schibilla et al. |
| 6,297,926 B1 | 10/2001 | Ahn |
| 6,330,626 B1 | 12/2001 | Dennin et al. |
| 6,374,370 B1 * | 4/2002 | Bockhaus et al. ............. 714/39 |
| 6,381,659 B2 | 4/2002 | Proch et al. |
| 6,401,149 B1 | 6/2002 | Dennin et al. |
| 6,470,461 B1 | 10/2002 | Pinvidic et al. |
| 6,487,631 B2 | 11/2002 | Dickinson et al. |
| 6,490,635 B1 | 12/2002 | Holmes |
| 6,530,000 B1 | 3/2003 | Krantz et al. |
| 6,574,676 B1 | 6/2003 | Megiddo |
| 6,662,334 B1 | 12/2003 | Stenfort |
| 6,721,905 B2 * | 4/2004 | Ohwada ........................ 714/30 |
| 6,826,650 B1 | 11/2004 | Krantz |
| 7,039,840 B2 * | 5/2006 | Chan et al. .................... 714/724 |
| 7,062,689 B2 | 6/2006 | Slobodnik |
| 7,111,190 B2 * | 9/2006 | Venkatraman et al. ........... 714/6 |
| 7,120,841 B2 * | 10/2006 | Ohlhoff ......................... 714/718 |
| 7,533,309 B2 * | 5/2009 | Mukherjee et al. ........... 714/718 |

| | | | |
|---|---|---|---|
| 2001/0044873 | A1 | 11/2001 | Wilson et al. |
| 2002/0016897 | A1* | 2/2002 | Nerl .............................. 711/170 |
| 2002/0062462 | A1* | 5/2002 | Ohwada ........................ 714/30 |
| 2002/0133773 | A1* | 9/2002 | Richter et al. ................. 714/733 |
| 2003/0037225 | A1 | 2/2003 | Deng et al. |
| 2003/0106004 | A1* | 6/2003 | Ricchetti et al. .............. 714/733 |
| 2004/0006729 | A1* | 1/2004 | Pendurkar ..................... 714/733 |
| 2004/0158786 | A1* | 8/2004 | Caty et al. ..................... 714/733 |
| 2004/0230395 | A1* | 11/2004 | Basto ............................ 702/117 |
| 2005/0076194 | A1* | 4/2005 | Kanapathippillai et al. .. 712/241 |
| 2005/0204231 | A1* | 9/2005 | Mukherjee et al. ........... 714/733 |
| 2005/0257109 | A1* | 11/2005 | Averbuj et al. ................ 714/733 |

FOREIGN PATENT DOCUMENTS

| | | |
|---|---|---|
| EP | 0622726 | 11/1994 |
| EP | 0718827 | 6/1996 |
| GB | 2285166 | 6/1995 |
| JP | 63-292462 | 11/1988 |
| JP | 01-315071 | 12/1989 |
| JP | 03183067 | 8/1991 |
| WO | 98/14861 | 4/1988 |

OTHER PUBLICATIONS

PCT search report for PCT/US00/07780 mailed Aug. 2, 2000, 4 pages.

PCT search report for PCT/US01/22404 mailed Jan. 29, 2003, 4 pages.

Blathut R.; "Digital Transmission of Information"; (Dec. 4, 1990), pp. 429-430.

Hwang, Kai and Briggs, Faye A., Computer Architecture and Parallel Processing:; pp. 156-164.

Zeidman, Bob; "Interleaving DRAMS for faster access", System Design ASIC & EDA, pp. 24-34 (Nov. 1993).

P.M. Bland et al, "Shared Storage Bus Circuitry"; IBM Technical Disclosure Bulletin, vol. 25, No. 4, Sep. 1982; pp. 2223-2224.

* cited by examiner

SYSTEM AND METHOD FOR CONDUCTING BIST OPERATIONS

CROSS-REFERENCE TO RELATED APPLICATIONS

This application is a continuation Application of U.S. patent application Ser. No. 10/983,944 filed on Nov. 8, 2004. The disclosure of the above application is incorporated herein by reference.

FIELD OF THE INVENTION

The present invention relates to integrated circuits, and more particularly, to conducting built in self-test "BIST" operations for memory modules.

BACKGROUND

Conventional computer systems typically include several functional components. These components may include a central processing unit (CPU), main memory, input/output ("I/O") devices, and storage devices (for example, tape drives, disk drives; referred to herein as a "storage device").

In conventional systems, the main memory is coupled to the CPU via a system bus or a local memory bus. The main memory is used to provide the CPU access to data and/or program information that is stored in main memory at execution time. Typically, the main memory is composed of random access memory (RAM) circuits. A computer system with the CPU and main memory is often referred to as a host system.

The storage device is coupled to the host system via a storage device controller that handles complex details of interfacing the storage device(s) to the host system. Communications between the host system and the controller is usually provided using one of a variety of standard input/output ("I/O") bus interfaces.

Storage controllers are coupled using various standards, for example, the fiber channel standard incorporated herein by reference in its entirety.

Storage controllers use various processors and memory units (or modules) for storing data/program instructions. For efficient and reliable transfer of data it is important to perform a BIST operation for memory units. Typically, a memory BIST controller is used to perform the BIST. A test access port ("TAP") controller described below may be used to initiate the memory BIST controller itself.

An industry standard, IEEE 11491.1 and 11491A (referred to as the JTAG standard) is often used for testing integrated circuits after assembly onto a printed circuit board. The JTAG standard is incorporated herein by reference in its entirety. Testing is performed using pins/interface associated with a test access port.

Testing of memory modules within a storage controller becomes a problem when the storage controller is mounted on a dense printed circuit board and there may not be enough room for a TAP interface. Even if there is room for a TAP interface, adding a TAP interface increases the overall board cost.

This problem is further magnified, when the storage controller is placed inside a rack or an enclosed environment. In this case getting access to the TAP interface is difficult without altering or tampering the enclosed environment.

Therefore, there is a need for a method and system for efficiently performing BIST for memory units in a storage controller or other similar environments.

SUMMARY OF THE INVENTION

In one aspect of the present invention, a method for initiating a built in self test ("BIST") operation for memory modules is provided. The method includes, determining if a test access port ("TAP") controller instruction or an internal register control bit are to be used for initiating the BIST operation; sending the internal register control bit to a memory BIST controller for initiating the BIST operation; and setting a status bit in the internal register after the BIST operation is complete.

The method also includes sending the TAP instruction to the memory BIST controller; and providing access to a BIST operation result via a TAP interface. The internal register is also used to set a bit that selects between the TAP instruction and the internal register control bit for initiating the BIST operation.

In yet another aspect of the present invention, a system for initiating a BIST operation for memory modules is provided. The system includes, an internal register for setting a control bit for initiating a BIST operation; a TAP controller for sending an instruction to a memory BIST controller to initiate a BIST operation; and a multiplexer for selecting between the control bit and the instruction for initiating the BIST operation.

If the control bit is used to initiate the BIST operation then a status bit is set in the internal register notifying a processor that the BIST operation is complete; and if the instruction is used to initiate the BIST operation, then a test result is accessible via a TAP interface.

In yet another aspect of the present invention, a storage controller for initiating a BIST operation for memory modules is provided. The storage controller includes an internal register for setting a control bit for initiating a BIST operation; a TAP controller for sending an instruction to a memory BIST controller to initiate a BIST operation; and a multiplexer for selecting between the control bit and the instruction for initiating the BIST operation.

This brief summary has been provided so that the nature of the invention may be understood quickly. A more complete understanding of the invention can be obtained by reference to the following detailed description of the preferred embodiments thereof in connection with the attached drawings.

BRIEF DESCRIPTION OF THE DRAWINGS

The foregoing features and other features of the present invention will now be described with reference to the drawings of a preferred embodiment. In the drawings, the same components have the same reference numerals. The illustrated embodiment is intended to illustrate, but not to limit the invention. The drawings include the following Figures.

DETAILED DESCRIPTION OF THE PREFERRED EMBODIMENTS

To facilitate an understanding of the preferred embodiment, the general architecture and operation of a controller will initially be described. The specific architecture and operation of the preferred embodiment will then be described with reference to the general architecture.

Figure 1A:
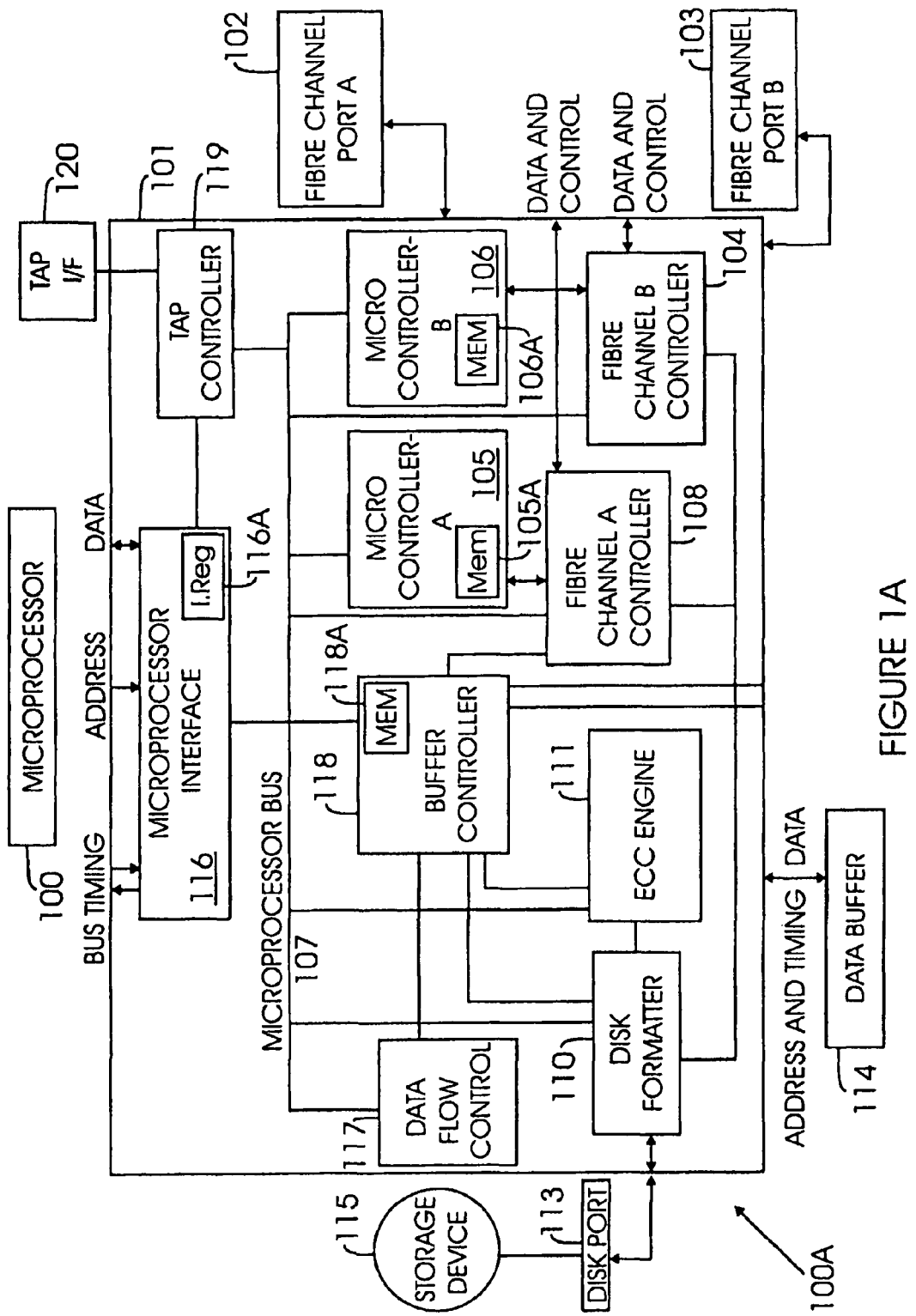
FIG. 1A is a block diagram of a controller, used according to one aspect of the present invention.

System 100A of FIG. 1A is an example of a storage system controller, included (or coupled to) in a computer system. The host computer (not shown) and a storage device 115 communicate via port 113. In an alternate embodiment (not shown), the storage device 115 is an external storage device, which is connected to the host computer via a data bus. Those skilled in the art will appreciate that various communication buses known in the art can be used to transfer data between the drive and the host system.

As shown in FIG. 1A, the system includes controller 101, which is coupled to fiber channel ports 102 and 103, buffer memory 114 and microprocessor 100. Interface 116 serves to couple microprocessor bus 107 to microprocessor 100. A read only memory ("ROM") omitted from the drawing is used to store firmware code executed by microprocessor 100.

Controller 101 can be an integrated circuit (IC) that comprises of various functional modules, which provide for the writing and reading of data stored on storage device 115 or to other devices through fiber channel ports 102 and 103.

Microprocessor 100 is coupled to controller 101 via interface 116 to facilitate transfer of data, address, timing and control information. Buffer memory 114 is coupled to controller 101 via ports to facilitate transfer of data, timing and address information.

Data flow controller 117 is connected to microprocessor bus 107 and to buffer controller 118. Disk formatter 110 formats data that is flowing through system 100A, either from storage device 115 or from fiber channel ports 102/103.

Fibre channel controllers ("A") 108 and ("B") 104 include programmable registers and state machine sequencers that interface with ports 102 and 103. The fibre channel controllers 108 and 104 provide fibre channel control for ports 102 and 103.

Microcontrollers ("A") 105 and ("B") 106 allow customization of fibre channel sequences and control Fibre channel controllers 108 and 104 through a microcontroller interface module (not shown). ECC engine 111 provides error correction for system 100A.

Various memory modules exists in controller 101, for example, memory 105A, 106A and 118A.

TAP controller 119, described in more detail below, is used to control the BIST operation for various memory modules. Information from TAP controller 119 maybe sent via TAP interface ("TAP I/F") 120 and accessed outside system 100A. As discussed above, in some systems TAP I/F 120 may not be available and hence it becomes difficult to perform the BIST tests.

Figure 1B:
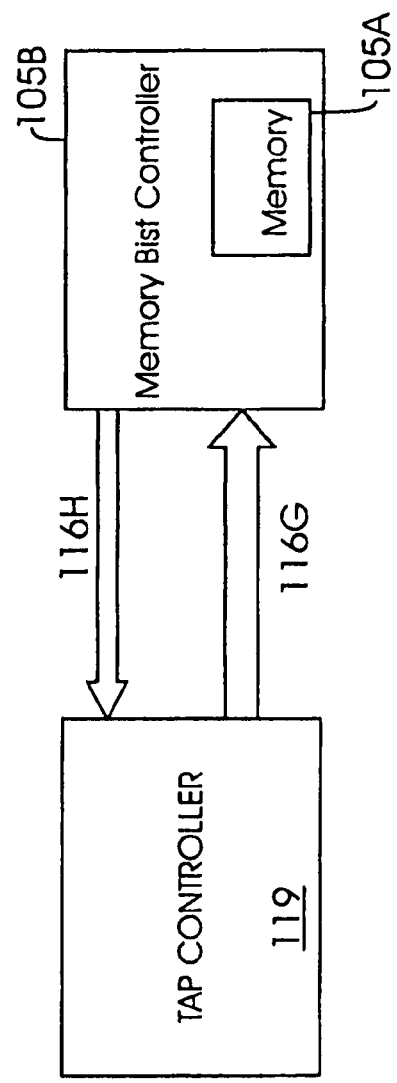
FIG. 1B shows a block diagram where a TAP controller controls the BIST operation.
Figure 2:
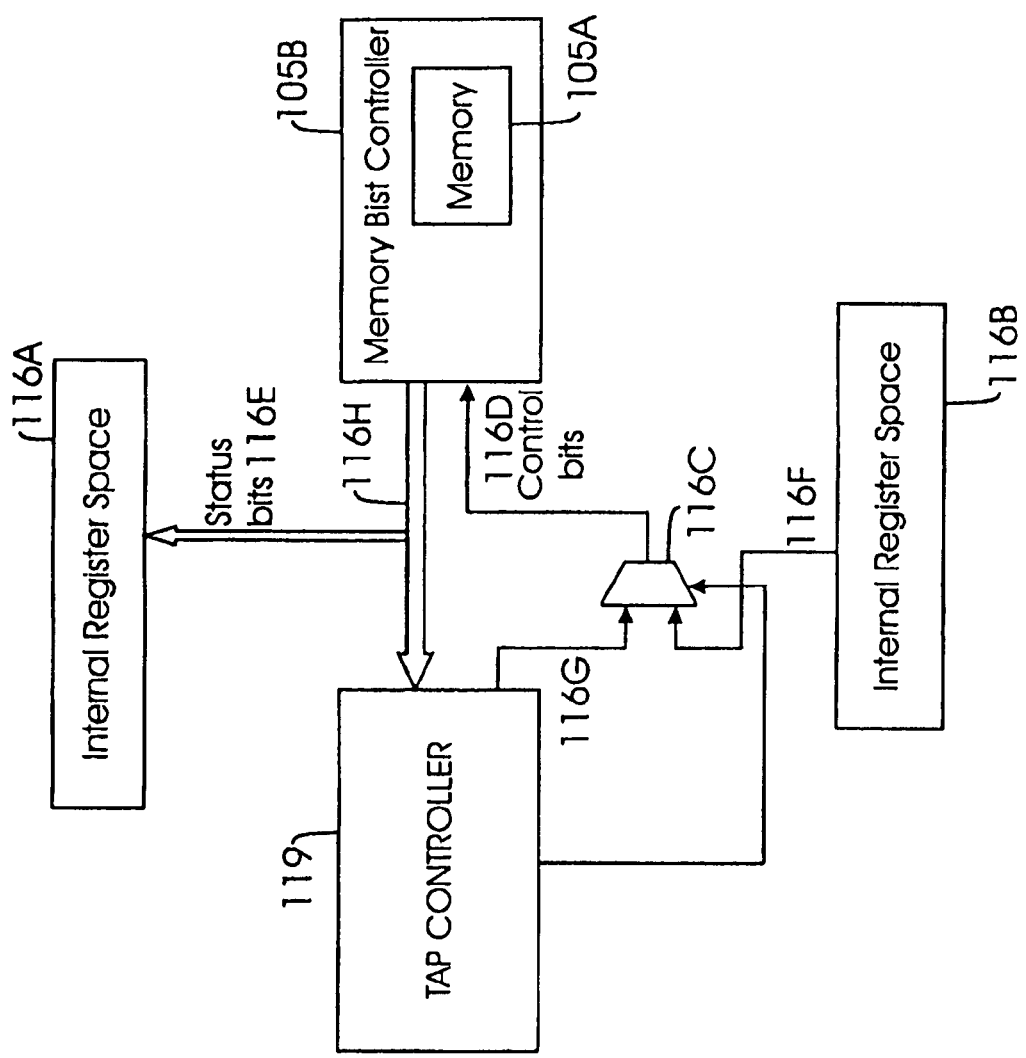
FIG. 2 shows a dual mode BIST control block diagram, according to one aspect of the present invention.

The adaptive aspects of the present invention, allow storage controller 101 to perform the BIST in dual modes. In a first mode, as shown in FIG. 1B, if the TAP I/F 120 is present and detected by controller 101, the BIST may be performed so that BIST results are accessible via TAP I/F 120. In another mode, as shown in FIG. 2, internal register bits are used to initiate the BIST operation and the results are accessible to processor 100 via register reads. The modes may be programmed by firmware using an internal configuration register 116A.

FIG. 1B shows tap controller 119 coupled to a memory controller 105B that controls the BIST operation for memory 105A. Instructions 116G from TAP controller 119 are sent to memory BIST controller 105B and after the test is performed, the results 116H are sent to TAP controller 119. The results 116H may be accessed by a system external to storage controller 101 via TAP I/F 120.

FIG. 2 shows a block diagram where the BIST operation is initiated by using internal register commands. Internal register 116B includes control bits that are used to trigger a BIST operation. Processor 100 may set the control bits. Control bits 116F (also shown as 116D) are sent to BIST controller 105B via multiplexer ("Mux") 116C. Mux 116C also receives instructions 116G from TAP controller 119. Instructions 116G may be selected to initiate a BIST operation (as shown in FIG. 1B) based on firmware programming. As shown in FIG. 2, in one implementation, the TAP controller 119 is configured to control (or initiate) a BIST operation for memory 105A of BIST controller 105B by controlling Mux 116C to select whether (i) instructions 116G are sent to BIST controller 105B or (ii) control bits 116F are sent to BIST controller 105B. In accordance with the JTAG standard incorporated by reference above, in one implementation, the instructions 116G can be received via TAP I/F 120 (FIG. 1).

Memory BIST controller 105B starts and controls the BIST operation for memory 105A. The results 116H are sent to register 116A with status bits 116E. The status bits 116E may be used to generate an interrupt for processor 100. This notifies processor 100 that BIST results are available. Results 116H may also be made available via TAP interface 120.

It is noteworthy that although FIG. 2 shows two registers 116A and 116B, only a single register may be used to initiate the BIST operation described above with respect to FIG. 2 and below with respect to FIG. 3.

Figure 3:
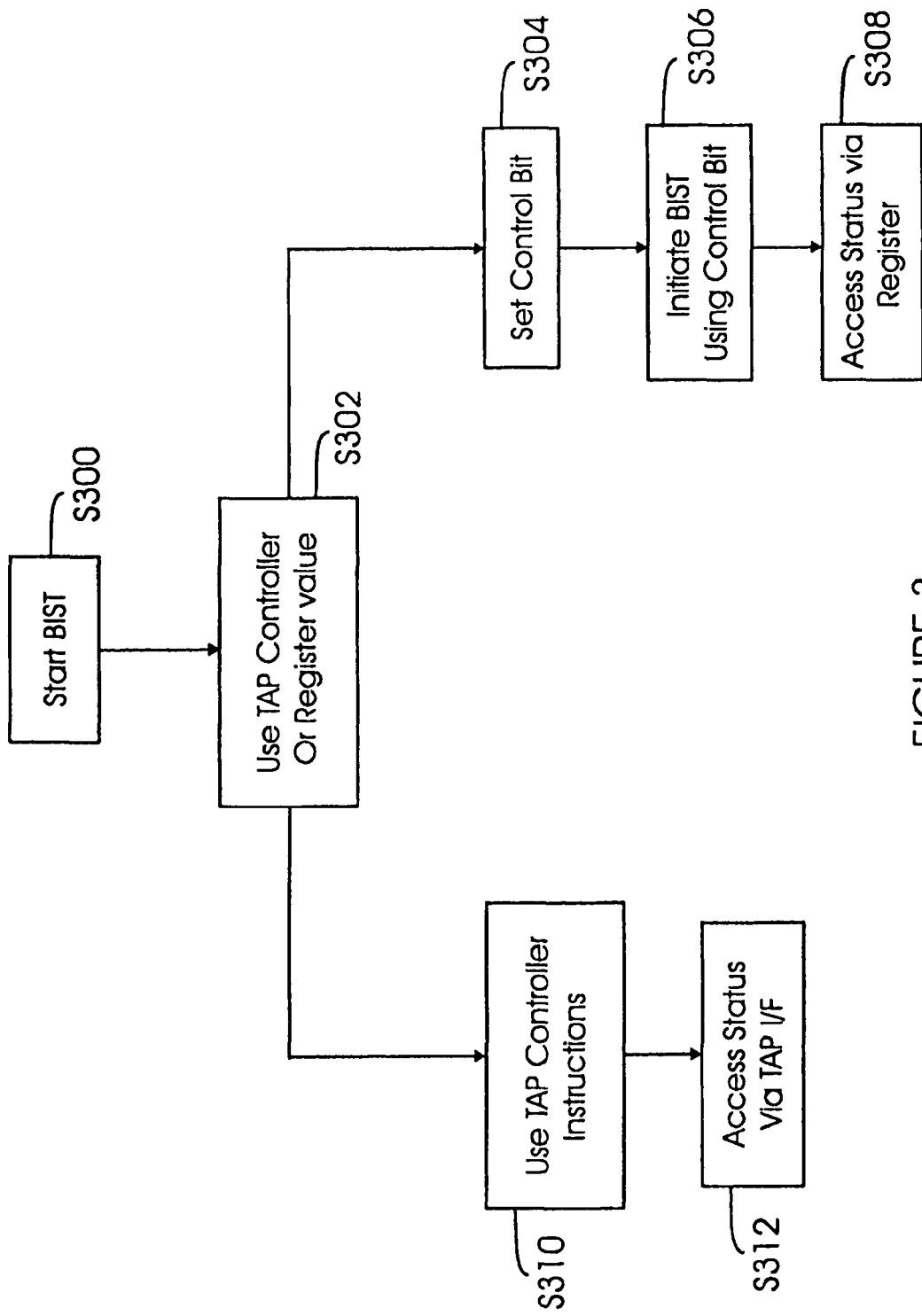
FIG. 3 shows a process flow diagram for conducting a BIST, according to one aspect of the present invention.

FIG. 3 shows a process flow diagram for conducting a BIST operation, according to one aspect of the present invention. Turning in detail to FIG. 3, in step S300, the BIST process is started. In step S302, the process determines whether to use the TAP controller 119 (as shown in FIG. 1B) or an internal register value, as shown in FIG. 2, to initiate the BIST operation.

If the TAP controller 119 is used, then in step S310, standard TAP controller 119 instructions (116G) are used to initiate the BIST operation. The test results may be accessed in step S312 using TAP interface 120.

If register control bits are used (step S302), then in step S304, control bits are set in internal register 116B. In step S306, control bits 116F are used to activate memory BIST controller 105B (shown as 116D via Mux 116C). In step S308, after the test is completed status bits 116E are set in register 116A so that processor 100 may be notified of test completion and provide access to the test results.

In one aspect of the present invention, a user can use the internal register technique to initiate a BIST operation and hence no TAP Interface 120 is required. In another aspect of the present invention, a user has the flexibility of initiating a BIST operation either by using TAP controller instructions or internal register control bits.

Although the present invention has been described with reference to specific embodiments, these embodiments are illustrative only and not limiting. Many other applications and embodiments of the present invention will be apparent in light of this disclosure.

What is claimed is:

1. A storage controller comprising:
a first controller, wherein the first controller includes a memory module;
a test access port controller in communication with the first controller, the test access port controller configured to control a built in self-test operation on the memory module of the first controller; and
a register configured to store a first instruction,
wherein in response to the storage controller detecting a test access port interface being accessible to the storage controller, the test access port controller is configured to control the built in self-test operation on the memory module of the first controller by having either (i) a second instruction sent from the test access port controller to the first controller or (ii) the first instruction sent from the register to the first controller, wherein the first controller is configured to perform the built in self-test operation on the memory module in response to having received the first instruction or having received the second instruction.

2. The storage controller of claim 1, wherein the test access port controller is configured to receive the second instruction via the test access port interface.

3. The storage controller of claim 1, wherein:
the test access port controller is further configured to receive a result of the built in self-test operation; and
the result is accessible to a system that is external to the storage controller via the test access port interface.

4. The storage controller of claim 1, wherein the first controller is a controller selected from the group consisting of a buffer controller, a microcontroller, and a memory controller.

5. The storage controller of claim 1, further comprising:
a microprocessor interface in communication with a microprocessor, wherein the microprocessor sets the first instruction within the register via the microprocessor interface.

6. The storage controller of claim 5, wherein the first instruction comprises control bits.

7. The storage controller of claim 6, further comprising:
a second register configured to store a result of the built in self-test operation,
wherein in response to the second register receiving the result of the built in self-test operation, an interrupt to the microprocessor is generated to notify the microprocessor that the result of the built in self-test operation is available.

8. The storage controller of claim 1, wherein the first instruction is compliant with industry standard IEEE 11491.1 or industry standard IEEE 11491 A.

9. A computer system comprising:
the storage controller of claim 1;
a microprocessor; and
a storage device,
wherein the storage controller interfaces the storage device to the microprocessor.

10. A method for performing a built in self-test operation on a memory module of a first controller, wherein the first controller is implemented on an integrated circuit of a storage controller, the method comprising:
storing a first instruction within a first register, wherein the first register is also implemented on the integrated circuit of the storage controller;
detecting whether a test access port interface is accessible to the storage controller; and
in response to a test access port interface being accessible to the storage controller, sending either (i) a second instruction via the test access port interface to the first controller or (ii) the first instruction from the register to the first controller,
wherein the first controller is configured to perform the built in self-test operation on the memory module in response to having received the first instruction or having received the second instruction.

11. The method of claim 10, wherein a result of the built in self-test operation is accessible to a system that is external to the storage controller via the test access port interface.

12. The method of claim 10, wherein the first controller is a controller selected from the group consisting of a buffer controller, a microcontroller, and a memory controller.

13. The method of claim 10, wherein the first instruction is compliant with industry standard IEEE 11491.1 or industry standard IEEE 11491A.

* * * * *